(12) United States Patent
Banba

(10) Patent No.: US 7,646,252 B2
(45) Date of Patent: Jan. 12, 2010

(54) AMPLIFIER FOR USE IN RADIO-FREQUENCY BAND

(75) Inventor: Seiichi Banba, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 12/004,519

(22) Filed: Dec. 21, 2007

(65) Prior Publication Data

US 2008/0169877 A1 Jul. 17, 2008

(30) Foreign Application Priority Data

Dec. 21, 2006 (JP) .............................. 2006-344492
Dec. 6, 2007 (JP) .............................. 2007-315885

(51) Int. Cl.
*H03F 1/22* (2006.01)
(52) U.S. Cl. ..................... 330/311; 330/286; 330/310
(58) Field of Classification Search ................... 330/98, 330/277, 282, 290, 306, 310, 311
See application file for complete search history.

(56) References Cited

U.S. PATENT DOCUMENTS 4,658,220 A * 4/1987 Heston et al. ............... 330/311

2008/0048785 A1 * 2/2008 Mokhtar et al. ............. 330/311

FOREIGN PATENT DOCUMENTS

JP 2003-289226 10/2003

OTHER PUBLICATIONS

Matthaei, G., et al., "Microwave Filters, Impedance-Matching Networks, and Coupling Structures", 1980, pp. 95-104 and pp. 438-440.
Razavi, B., "Design of Analog CMOS Integrated Circuits", p. 64 and pp. 85-86.

* cited by examiner

*Primary Examiner*—Khanh V Nguyen
(74) *Attorney, Agent, or Firm*—McDermott Will & Emery LLP

(57) ABSTRACT

A cascade-connected transistor includes a common-source transistor which receives an input signal, and a common-gate transistor which is connected to a drain terminal of the common-source transistor and outputs an output signal. A bandpass filter receives the output signal of the cascade-connected transistors. An adjustment circuit is interposed between the drain terminal and the gate terminal of the common-gate transistor, and adjusts the output impedance of the cascade-connected transistor.

8 Claims, 26 Drawing Sheets

FIG.3

| ORDER, TYPE | RIPPLE | L, C CONSTANTS | RETURN LOSS (3~5GHz) |
|---|---|---|---|
| THIRD-ORDER Chebyshev | 0.5dB | L1=1.494nH, C1=1.130pF<br>L2=4.112nH, C2=0.411pF | -13dB OR LESS |
| SECOND-ORDER Butterworth | | L21=1.324nH, C21=1.275pF<br>L22=3.189nH, C22=0.530pF | -25dB OR LESS |

CENTER FREQUENCY 3.873GHz, BANDWIDTH 8.5GHz, REFERENCE IMPEDANCE 50Ω

FIG.14

| RIPPLE | BANDWIDTH fbw | L, C CONSTANTS | RETURN LOSS (3~5GHz) |
|---|---|---|---|
| | CENTER FREQUENCY 3.873GHz, REFERENCE IMPEDANCE 50Ω | | |
| 0.01dB | 2.0GHz | L1=2.503nH, C1=0.675pF<br>L2=1.093nH, C2=1.544pF | −26dB OR LESS |
| 0.1dB | 4.2GHz | L1=1.955nH, C1=0.864pF<br>L2=1.942nH, C2=0.870pF | −16dB OR LESS |
| 0.2dB | 4.2GHz | L1=2.325nH, C1=0.726pF<br>L2=1.933nH, C2=0.873pF | −13dB OR LESS |
| 0.5dB | 4.2GHz | L1=3.025nH, C1=0.558pF<br>L2=2.032nH, C2=0.831pF | −13dB OR LESS |
| 0.5dB | 5.5GHz | L1=2.310nH, C1=0.731pF<br>L2=2.661nH, C2=0.653pF | −13dB OR LESS |

FIG.19

CENTER FREQUENCY 3.873GHz, REFERENCE IMPEDANCE 50Ω

| BANDWIDTH fbw | L, C CONSTANTS | RETURN LOSS (3~5GHz) |
|---|---|---|
| 2.0GHz | L21=5.627nH, C21=0.300pF<br>L22=0.750nH, C22=2.251pF | −3dB OR LESS |
| 4.2GHz | L21=2.680nH, C21=0.630pF<br>L22=1.576nH, C22=1.072pF | −13dB OR LESS |
| 5.5GHz | L21=2.046nH, C21=0.825pF<br>L22=2.063nH, C22=0.818pF | −17dB OR LESS |
| 8.5GHz | L21=1.324nH, C21=1.275pF<br>L22=3.189nH, C22=0.530pF | −25dB OR LESS |

AMPLIFIER FOR USE IN RADIO-FREQUENCY BAND

CROSS-REFERENCE TO RELATED APPLICATIONS

This application is based upon and claims the benefit of priority from the prior Japanese Patent Applications No. 2006-344492, filed Dec. 21, 2006, and Japanese Patent Application No. 2007-315885, filed Dec. 6, 2007, the entire contents of which are incorporated herein by reference.

BACKGROUND OF THE INVENTION

1. Field of the Invention

The present invention relates to an amplifier for use in a radio-frequency band.

2. Description of the Related Art

High gain and high output power are essential features of amplifiers to be used in GHz bands, and for output amplifiers in particular, and it is of extreme importance to provide output matching in the bands used. Inadequate output matching can cause unnecessary reflection from external circuits such as an antenna, with the occurrence of abnormal circuit oscillation and the like. Output amplifiers to be used in an ultra-wideband communication system such as UWB must provide output matching across the entire band.

Radio-frequency transmitters typically have a band-pass filter in the prior stage of an antenna so as to eliminate harmonics other than the carrier frequency. In order for such a band-pass filter to have favorable pass band characteristics, its circuit constants must be set accurately with respect to the application-required center frequency and bandwidth.

SUMMARY OF THE INVENTION

Under these circumstances, the inventor has found a technique capable of easily providing filter characteristics and output matching when designing an amplifier that has a band-pass filter or the like as a load. The present invention has been achieved in view of the foregoing circumstances, and a general purpose thereof is to provide an amplifier which can easily provide a load characteristic and output matching.

An amplifier according to one embodiment of the present invention includes a cascode-connected transistor including: a common-source transistor which receives an input signal; and a common-gate transistor which is connected to a drain terminal of the common-source transistor and outputs an output signal. An adjustment circuit for adjusting an output impedance of the cascode-connected transistor is interposed between a drain terminal and a gate terminal of the common-gate transistor.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 3 is a diagram showing examples of circuit constants of the third-order Chebyshev BPF and the second-order Butterworth BPF shown in FIGS. 1 and 2, respectively;

FIG. 14 is a diagram showing examples of the circuit constants of the third-order Chebyshev BPF according to embodiment 1;

FIG. 19 is a diagram showing examples of the circuit constants of a second-order Butterworth BPF according to embodiment 2;

DETAILED DESCRIPTION OF THE INVENTION

Figure 1:
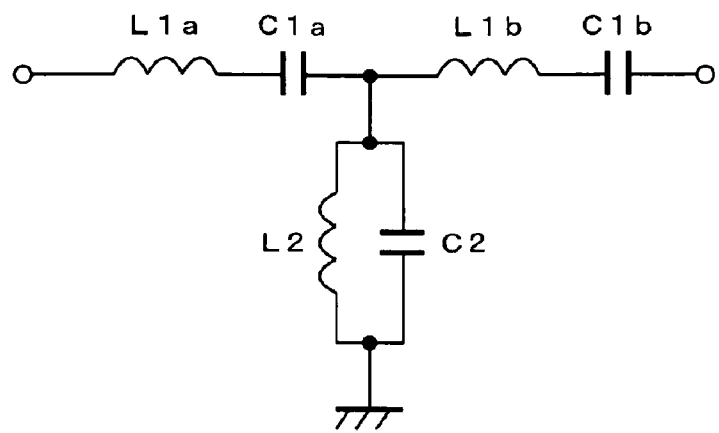
FIG. 1 is a diagram showing the circuit configuration of a third-order Chebyshev BPF.

The invention will now be described by reference to the preferred embodiments. This does not intend to limit the scope of the present invention, but to exemplify the invention.

Before describing the embodiments of the present invention in detail, a description will initially be given of typical modes of the embodiments. An amplifier according to one embodiment of the present invention includes a cascode-connected transistor including: a common-source transistor which receives an input signal; and a common-gate transistor which is connected to a drain terminal of the common-source transistor and outputs an output signal. An adjustment circuit for adjusting an output impedance of the cascode-connected transistor is interposed between a drain terminal and a gate terminal of the common-gate transistor. The "adjustment circuit" may be composed of a series circuit including an adjustment resistor and an adjustment capacitor. It should be noted that "source terminal" may be read as "emitter terminal," "gate terminal" may be read as "base terminal," and "drain terminal" may be read as "collector terminal."

According to this embodiment, the output impedance of the cascode-connected transistor can be adjusted to easily provide load characteristics and output matching.

An amplifier according to another embodiment of the present invention includes a cascode-connected transistor including: a common-source transistor which receives an input signal; and a common-gate transistor which is connected to a drain terminal of the common-source transistor and outputs an output signal. An adjustment circuit for adjusting an output impedance of the cascode-connected transistor is interposed between a drain terminal of the common-gate transistor and a terminal that is grounded in terms of alternating current. The "terminal that is grounded in terms of alternating current" may be a power supply terminal or a ground terminal. Note that "source terminal" may be read as "emitter terminal," "gate terminal" may be read as "base terminal," and "drain terminal" may be read as "collector terminal."

According to this embodiment, the output impedance of the cascode-connected transistor can be adjusted to easily provide load characteristics and output matching.

The amplifier may further include a band-pass filter which receives the output signal of the cascode-connected transistor. The cascode-connected transistor may have an output equivalent resistance and an output equivalent capacitance whose values make circuit constants that determine a characteristic of the band-pass filter. The adjustment resistor and the adjustment capacitor may adjust the values of the output equivalent resistance and the output equivalent capacitance of the cascode-connected transistor.

According to this embodiment, the output equivalent resistance and the output equivalent capacitance of the cascode-connected transistor can be adjusted to easily provide band-pass filter characteristics and output matching.

The amplifier may further include a band-pass filter which receives the output signal of the cascode-connected transistor. The band-pass filter may include: a first inductor which is connected to the drain terminal of the common-gate transistor; a parallel circuit of a second inductor and a second capacitor which are interposed between the other terminal of the first inductor and a power supply terminal; and a series circuit of a third inductor and a third capacitor which are interposed between the other terminal of the first inductor and an output terminal of the amplifier.

According to this embodiment, the output equivalent capacitance of the cascode-connected transistor can be utilized to form a band-pass filter, thereby providing band-pass filter characteristics and output matching in a consistent fashion.

The amplifier may further include a band-pass filter which receives the output signal of the cascode-connected transistor. The band-pass filter may include: a first inductor which is connected to the drain terminal of the common-gate transistor; and a parallel circuit of a second inductor and a second capacitor which are interposed between the other terminal of the first inductor and a power supply terminal. The other terminal of the first inductor may be connected to an output terminal of the amplifier.

According to this embodiment, the output equivalent capacitance of the cascode-connected transistor can be utilized to form a band-pass filter, thereby providing band-pass filter characteristics and output matching in a consistent fashion.

An output equivalent circuit which expresses the output impedance of the cascode-connected transistor may be approximated by a series circuit of the output equivalent resistance and the output equivalent capacitance. The output equivalent resistance may correspond to a reference resistor of the band-pass filter. The output equivalent capacitance may correspond to one of a plurality of circuit constants that determine the characteristics of the band-pass filter.

According to this embodiment, the output equivalent resistance and the output equivalent capacitance of the cascode-connected transistor can be adjusted to easily provide band-pass filter characteristics and output matching.

The amplifier may further include an amplifier stage in front of the cascode-connected transistor, the amplifier stage having a series circuit of a load inductor and a load resistor as a load. According to this embodiment, it is possible to flatten the gain further in a desired band.

It should be appreciated that arbitrary combinations of the foregoing constituting elements, and implementations of the invention in the form of methods, apparatuses, systems, and the like are also applicable as embodiments of the present invention.

A basic configuration according to an embodiment of the present invention will now be described. The basic configuration according to the present embodiment is such that a band-pass filter (hereinafter, referred to as BPF) composed of inductors and capacitors is arranged on the output terminal of a cascode-connected field effect transistor (hereinafter, referred to as cascode-connected FET) which is often used as the basic amplifier circuit of a silicon RFIC (Radio-Frequency Integrated Circuit). An adjustment circuit having a resistor and a capacitor connected in series is interposed between the drain terminal and the gate terminal of the common-gate FET part of the cascode-connected FET. It should be appreciated that the adjustment circuit is not necessarily limited to the circuit configuration of providing feedback as will be described later. Since the following description will deal primarily with the circuit configuration of providing feedback, however, a circuit configuration of providing no feedback will also be referred to as a feedback circuit (a series circuit including a feedback resistor and a feedback capacitor) for the sake of convenience. This feedback circuit is used to adjust the output impedance or the output equivalent circuit constants of the cascode-connected FET. Consequently, the amplifier having a cascode-connected FET and a BPF can provide output matching over a wide bandwidth while achieving desired BPF characteristics including these output equivalent circuit constants.

Consisting of inductors and capacitors, or lumped-parameter elements, the BPF has a center frequency, bandwidth, and order as its significant design items. More specifically, BPFs are classified into Butterworth type, Chebyshev type, and so on, by pass band characteristics and the L and C values are determined by type (for example, G. Matthaei "Microwave Filters, Impedance-Matching Networks, and Coupling Structures" 1980, pp. 95-104, pp. 438-440).

FIG. 1 shows the circuit configuration of a third-order Chebyshev BPF 10. This third-order Chebyshev BPF 10 has a series circuit of a first inductor L1$a$, a second capacitor C1$a$, a third inductor L1$b$, and a third capacitor C1$b$ which are connected in this order, between an input terminal and an output terminal. A parallel circuit of a second inductor L2 and a second capacitor C2 is interposed between the ground and a node between the first capacitor C1$a$ and the third inductor L1$b$.

Figure 2:
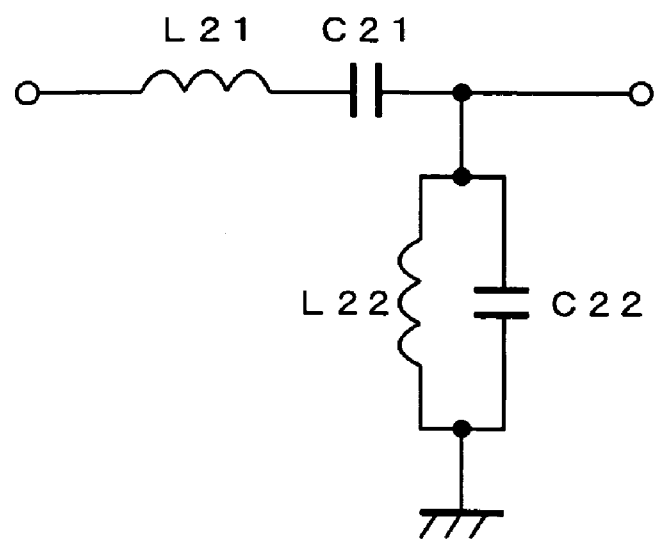
FIG. 2 is a diagram showing the circuit configuration of a second-order Butterworth BPF.

FIG. 2 shows the circuit configuration of a second-order Butterworth BPF 20.

This second-order Butterworth BPF 20 has a series circuit of a fourth inductor L21 and a fourth capacitor C21 which are connected in this order, between an input terminal and an output terminal. A parallel circuit of a second inductor L22 and a second capacitor C22 is interposed between the ground and a node between the fourth capacitor C21 and the output terminal.

FIG. 3 shows examples of circuit constants of the third-order Chebyshev BPF 10 and the second-order Butterworth BPF 20 shown in FIGS. 1 and 2. These examples of circuit constants are predicated on the basis that the third-order Chebyshev BPF 10 and the second-order Butterworth BPF 20 have a reference impedance of 50 Ω, a center frequency of 3.873 GHz, and a 3-dB bandwidth of 8.5 GHz. The reference impedance is a value matched with the impedance of an antenna to be described later. For the third-order Chebyshev BPF 10, inband ripple is another design item. The first inductor L1$a$ and the third inductor L1$b$, and the first capacitor C1$a$ and the third capacitor C1$b$ shown in FIG. 1, are set to the same values, respectively.

Hereinafter, a description will be given of how the characteristics of the BPFs 10 and 20 can be suitably utilized to constitute an output matching circuit of the cascode-connected FET which provides matching with a desired center frequency and bandwidth.

Figure 4:
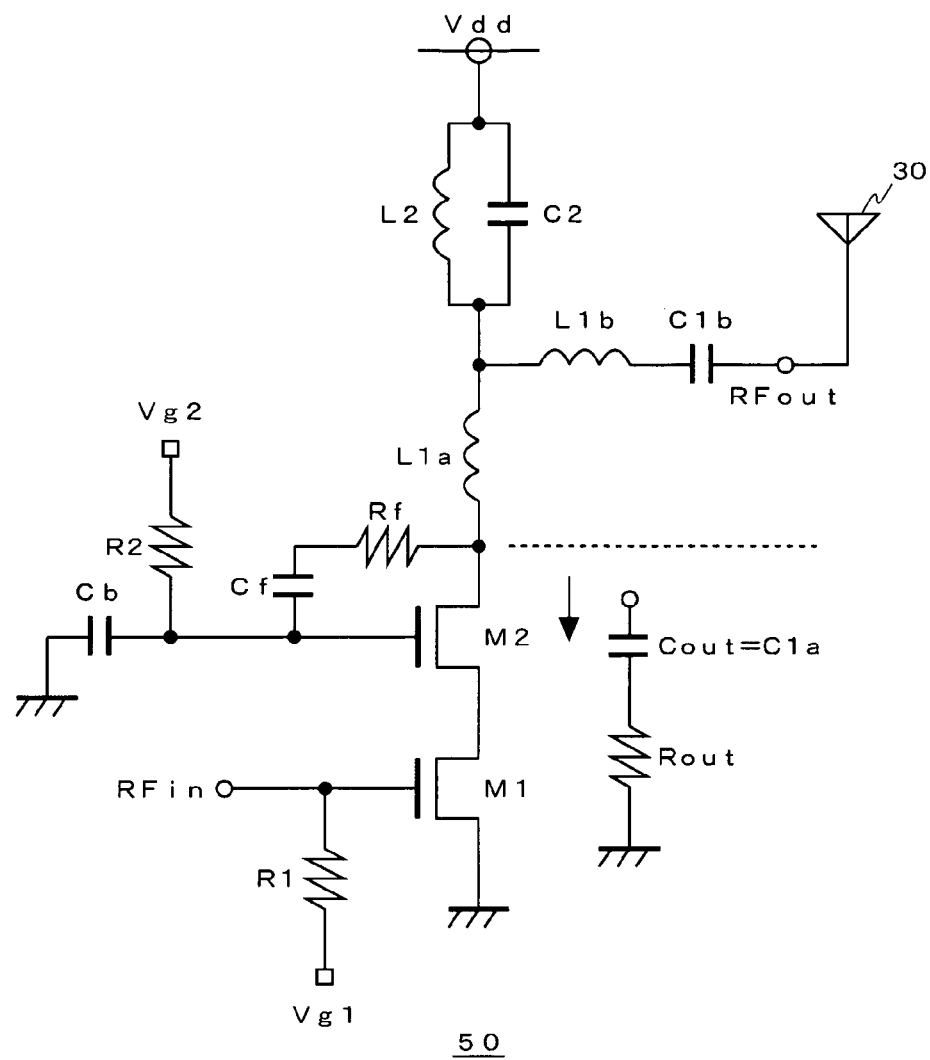
FIG. 4 is a diagram showing the circuit configuration of a wideband output amplifier for explaining the principle of an embodiment.

FIG. 4 is a diagram showing the circuit configuration of a wideband output amplifier 50 for explaining the principle of the present embodiment. The wideband output amplifier 50 is configured to implement a third-order Chebyshev BPF as a load on a transconductance amplifier which is composed of a cascode-connected FET. The wideband output amplifier 50 is primarily mounted on an RFIC. It amplifies a radio-frequency signal RFin input thereto, and outputs an amplified radio-frequency signal RFout to an antenna 30.

The cascode-connected FET is formed by connecting the drain terminal of a common-source FET (M1) and the source terminal of a common-gate FET (M2) to each other. The common-source FET (M1) makes an input stage, and the common-gate FET (M2) an output stage. A first bias voltage Vg1 is applied to the gate terminal of the common-source FET (M1) through a first resistor R1. The radio-frequency signal RFin, a small signal, is input from the prior stage. The source terminal of the common-source FET (M1) is grounded.

A second bias voltage Vg2 is applied to the gate terminal of the common-gate FET (M2) through a second resistor R2. A bypass capacitor Cb is connected to between the ground and a node between the gate terminal of the common-gate FET (M2) and the second resistor R2. A series circuit composed of a feedback resistor Rf and a feedback capacitor Cf is interposed as a feedback circuit between the drain terminal and the gate terminal of the common-gate FET (M2). An output equivalent circuit of the cascode-connected FET configured in this way can be approximated, when seen from the load side, by a series circuit of an output capacitance Cout and an output resistance Rout.

The drain terminal of the common-gate FET (M2) is connected to the input terminal of the third-order Chebyshev BPF. This third-order Chebyshev BPF is configured so that the first capacitor C1$a$ is omitted from the third-order Chebyshev BPF 10 shown in FIG. 1. The first capacitor C1$a$ is substituted by the output capacitance Cout of the cascode-connected FET. As above, if the output equivalent circuit of the cascode-connected FET can be approximated by a series connection of the output resistance Rout and the output capacitance Cout, and can be adjusted to desired values, then the internal equivalent circuit of the cascode-connected FET can constitute a BPF having desired characteristics, along with the feedback resistor Rf and the feedback capacitor Cf which are connected externally. This makes it possible to provide a favorable matching state and pass band characteristics within a desired band. That is, the output resistance Rout of the cascode-connected FET may be approximated to the reference impedance of the BPF, or typically 50 Ω. The output capacitance Cout of the cascode-connected FET may be matched with a circuit constant that realizes desired BPF characteristics. The feasibility of this technique will be discussed below.

Figure 5A:
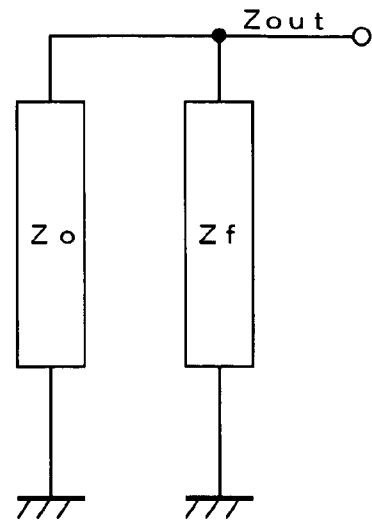
FIGS. 5A and 5B are principle diagrams for determining the output impedance of the cascode-connected FET according to the embodiment.
Figure 5B:
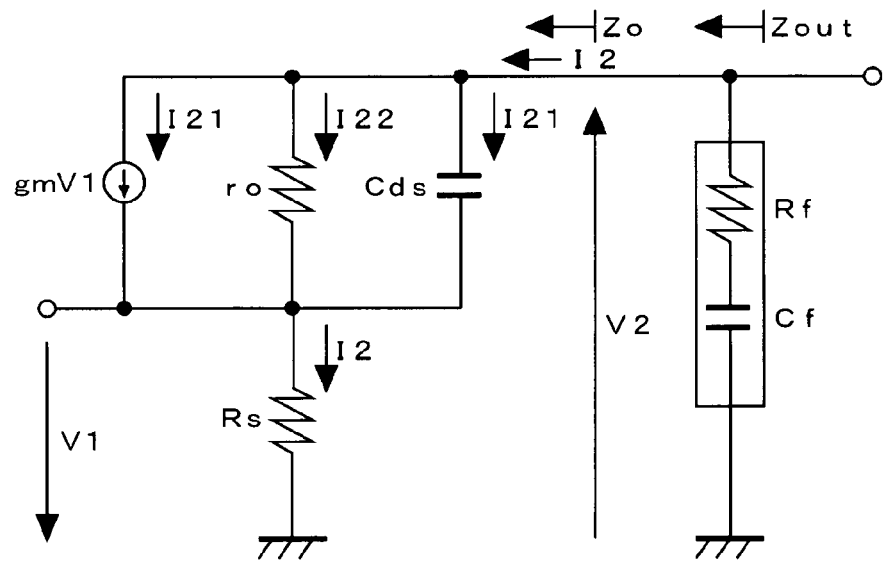

FIGS. 5A and 5B are principle diagrams for determining the output impedance of the cascode-connected FET according to the present embodiment. The output impedance of the cascode-connected FET is extremely high at low frequencies, and drops at high frequencies because of parasitic capacitances. When deriving the output impedance, literature will be consulted in which the output resistance of a cascode-connected FET is determined at low frequencies (for example, B. Razavi "Design of Analog CMOS Integrated Circuits" p. 64, pp. 85-86).

FIG. 5A shows that the output impedance Zout of the cascode-connected FET is the combined impedance of an output impedance Zo inside the cascode-connected FET and an impedance Zf of the foregoing feedback circuit. FIG. 5B shows a small-signal equivalent circuit of the cascode-connected FET shown in FIG. 3. The output impedance Zo inside the cascode-connected FET is predicated on the basis that the source-drain parasitic capacitance Cds of the common-gate FET (M2) is loaded as the most dominant parasitic component. The feedback circuit mentioned above is composed of the feedback resistor Rf and the feedback capacitor Cf connected in series. The impedance Zf of the present feedback circuit is the combined impedance of the feedback resistor Rf and the feedback capacitor Cf.

The common-gate FET (M2) can be regarded as a small-signal equivalent circuit in which a transconductance gm, a drain resistance ro, and the parasitic capacitance Cds are connected in parallel between the source and the drain. The common-source FET (M1) can be regarded as a drain resistance Rs when seen from the drain of the common-gate FET (M2).

Circuit equations for determining the output impedance Zout of the cascode-connected FET will be described below. Initially, the output impedance Zo inside the cascode-connected FET is given by the following (Eq. 1):

$$Z_O = V_2/I_2. \quad \text{(Eq. 1)}$$

Various parameters for solving this (Eq. 1) are given by the following (Eq. 2) to (Eq. 7).

It should be noted that these parameters correspond to those shown in FIG. 5:

$$V_2 = I_2 R_s + r_o I_{22}, \quad \text{(Eq. 2)}$$

$$I_2 = I_{21} + I_{22} + I_{23}, \quad \text{(Eq. 3)}$$

$$V_1 = -I_2 R_s, \quad \text{(Eq. 4)}$$

$$I_{21} = -g_m I_2 R_s, \quad \text{(Eq. 5)}$$

$$I_{22} = (I_{22} + I_{23}) \cdot \{Z_2/(r_o + Z_2)\}, \text{ and} \quad \text{(Eq. 6)}$$

$$Z_2 = 1/(j\omega C_{ds}). \quad \text{(Eq. 7)}$$

Using these parameters, the foregoing (Eq. 1) is transformed into the following (Eq. 8) which shows the output impedance Zo inside the cascode-connected FET:

$$Z_O = \frac{R_s r_O g_m}{(r_O \omega C_{ds})^2 + 1}\left[1 + \frac{r_O}{g_m}(\omega C_{ds})^2 - j\omega C_{ds} r_O\right] \quad \text{(Eq. 8)}$$

For the sake of simple notation of the formula for determining the output impedance Zout of the cascode-connected FET, part of the foregoing (Eq. 8) will now be defined as parameters A and B:

$$A \equiv \frac{R_s r_O g_m}{(r_O \omega C_{ds})^2 + 1} \quad \text{(Eq. 9)}$$

$$B \equiv 1 + \frac{r_O}{g_m}(\omega C_{ds})^2 \quad \text{(Eq. 10)}$$

The feedback circuit, which is composed of the feed resistor Rf and the feedback capacitor Cf connected in series, has a feedback impedance Zf which is expressed by the following (Eq. 11):

$$Z_f = R_f - j\frac{1}{\omega C_f} \quad \text{(Eq. 11)}$$

Finally, the output impedance Zo inside the cascode-connected FET and the feedback impedance Zf are combined to provide the output impedance Zout of the entire cascode-connected FET. The output impedance Zout of the cascode-connected FET is given by the following (Eq. 12):

$$Z_{out} = Z_O Z_f/(Z_O + Z_f). \quad \text{(Eq. 12)}$$

Using the group of parameters described above, the foregoing (Eq. 12) is transformed into the following (Eq. 13) which shows the output impedance Zout of the entire cascode-connected FET:

$$Z_{OUT} = \frac{\left(R_f - j\frac{1}{\omega C_f}\right)(B - j\omega C_{ds} r_O)}{R_f - j\frac{1}{\omega C_f} + (B - j\omega C_{ds} r_O)A} A \quad \text{(Eq. 13)}$$

$$= \frac{\omega^4 C_f^2 C_{ds}^2 R_f r_O^2 A + \omega^2 (C_f^2 R_f^2 + C_f^2 R_f B^2 A) + B}{(\omega C_f R_f + \omega C_f BA)^2 + (1 + \omega^2 C_{ds} C_f r_O A)^2} A -$$

$$j\frac{\omega^3(C_f^2 C_{ds} R_f^2 r_O + C_{ds}^2 C_f r_O^2 A) + \omega(C_f B^2 A + C_{ds} r_O)}{(\omega C_f R_f + \omega C_f BA)^2 + (1 + \omega^2 C_{ds} C_f r_O A)^2} A$$

As above, the formula for calculating the output impedance Zout of the cascode-connected FET that is provided with the feedback circuit is complicated and hard to understand intuitively. Hereinafter, the output equivalent circuit of the cascode-connected FET having the feedback circuit will be described through actual numerical calculation.

FIGS. 6 to 9 are charts showing the frequency dependence of the output equivalent circuit constants of the cascode-connected FET. FIGS. 6 to 9 are charts on which actual numerical calculations are plotted, with the frequency [GHz] on the horizontal axis and the output resistance Rout [Ω] and the output capacitance Cout [fF] on the vertical axis.

Figure 6:
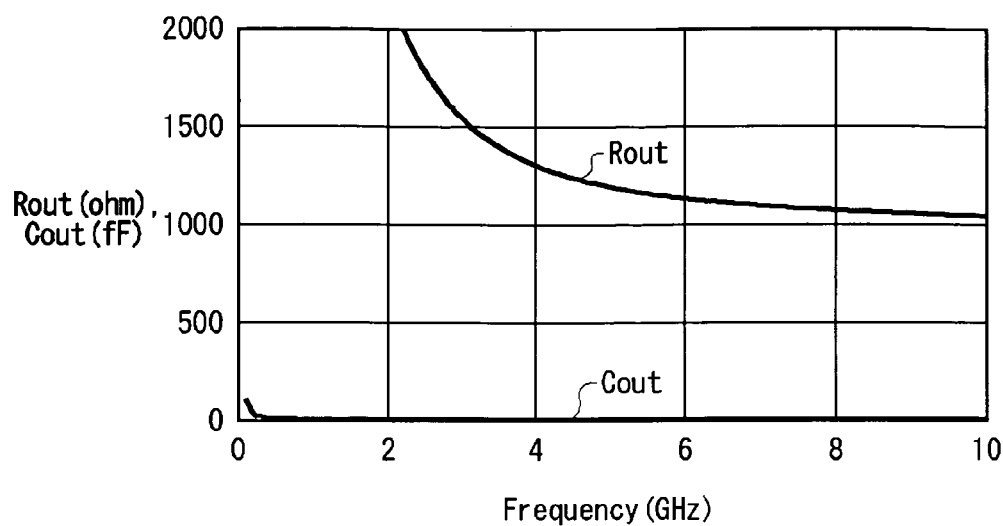
FIG. 6 is a chart showing the frequency dependence of output equivalent circuit constants of the cascode-connected FET (without a feedback circuit)
Figure 7:
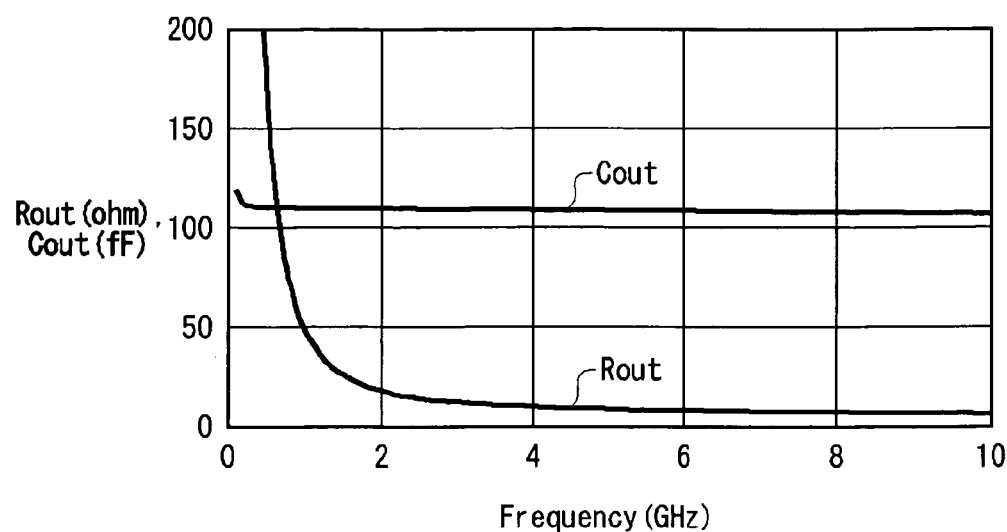
FIG. 7 is a chart showing the frequency dependence of the output equivalent circuit constants of the cascode-connected FET (with a feedback capacitor Cf having a capacitance of 100 fF and a feedback resistor Rf having a resistance of 0 $\Omega$)
Figure 8:
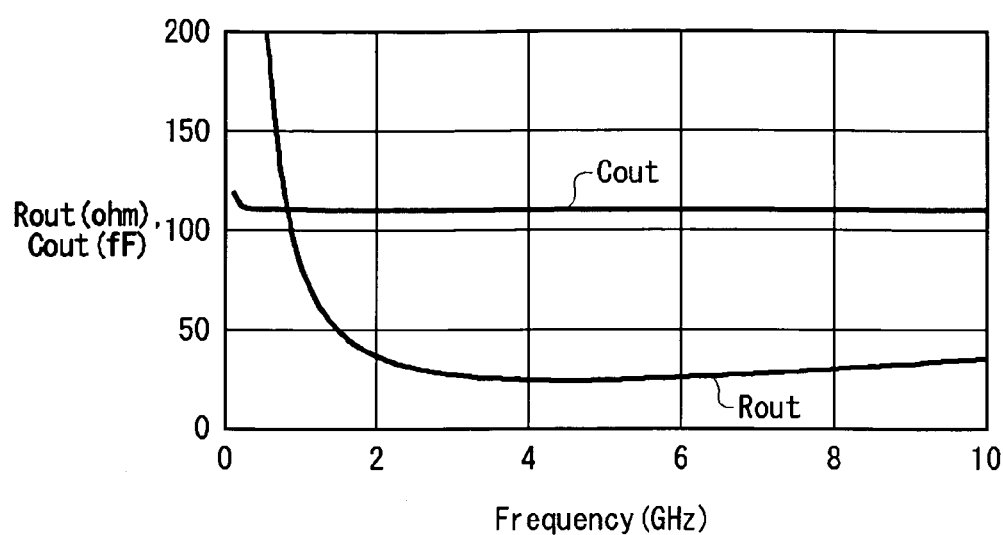
FIG. 8 is a chart showing the frequency dependence of the output equivalent circuit constants of the cascode-connected FET (with a feedback capacitor Cf having a capacitance of 100 fF and a feedback resistor Rf having a resistance of 100 $\Omega$)
Figure 9:
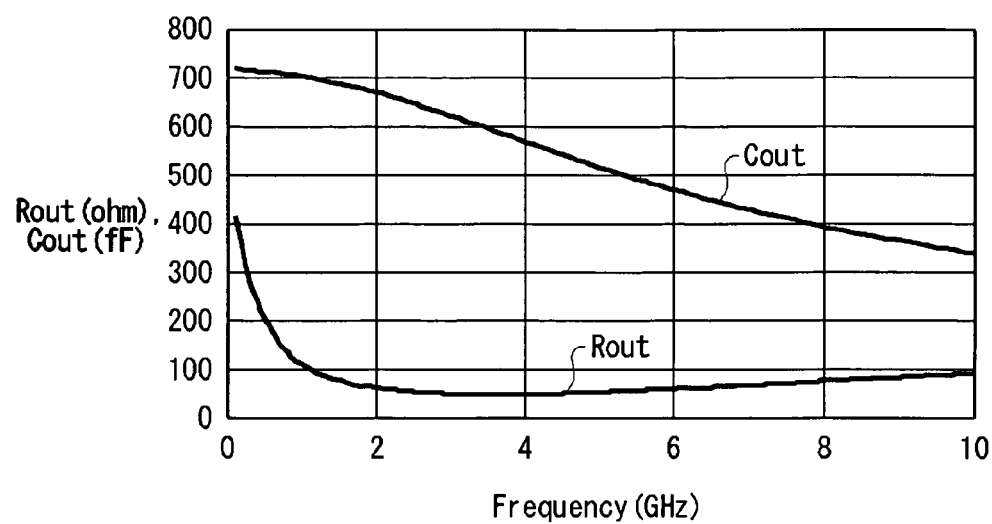
FIG. 9 is a chart showing the frequency dependence of the output equivalent circuit constants of the cascode-connected FET (with a feedback capacitor Cf having a capacitance of 700 fF and a feedback resistor Rf having a resistance of 275 $\Omega$)

FIG. 6 shows the frequency dependence when the cascode-connected FET is not provided with the foregoing feedback circuit. FIG. 7 shows the frequency dependence when the feedback circuit is composed of a feedback capacitor Cf having a capacitance of 100 fF and a feedback resistor Rf having a resistance of 0 Ω. That is, it illustrates the case where the feedback circuit does not include the feedback resistor Rf but the feedback capacitor Cf alone. FIG. 8 shows the frequency dependence when the feedback circuit is composed of a feedback capacitor Cf having a capacitance of 100 fF and a feedback resistor Rf having a resistance of 100 Ω. FIG. 9 shows the frequency dependence when the feedback circuit is composed of a feedback capacitor Cf having a capacitance of 700 fF and a feedback resistor Rf having a resistance of 275 Ω.

The other parameters are set as follows: In the cascode-connected FET, the drain resistance ro of the common-gate FET (M2) is set to 1 kΩ, the drain resistance Rs of the common-source FET (M1) is set to 1 kΩ, the drain-source parasitic capacitance Cds of the common-gate FET (M2) is set to 500 fF, and the transconductances gm of both the common-source FET (M1) and the common-gate FET (M2) are set to 50 mS.

Referring to FIGS. 6 to 9, it is shown that the output capacitance Cout has low frequency dependence and the output resistance Rout has high frequency dependence. In a certain frequency range, the output equivalent circuit of the cascode-connected FET can be approximated by a series circuit with a resistance and a capacitance.

As shown in FIG. 6, when no feedback circuit is interposed between the gate and drain of the common-gate FET (M2), the output resistance Rout has a high value of 1 kΩ or above, even at high frequencies. The output capacitance Cout has a significantly low value of the order of 10 fF. As shown in FIG. 7, when a feedback circuit consisting of only the feedback capacitor Cf is added without the feedback resistor Rf, the output capacitance Cout has a value of 110 fF, i.e., increases in value by as much as the value of the reference capacitor Cf. The output resistance Rout in turn drops to a value of around 10 Ω.

In contrast, as shown in FIGS. 8 and 9, when a feedback resistor Rf is also added to the configuration of the feedback circuit, it is possible to increase the feedback resistor Rf to several tens of Ω or so without much change in the output capacitance Cout. It can be seen that the output resistance Rout remains constant over a wider bandwidth when the feedback resistor Rf has a lower value in particular. In order to determine the BPF constants with high precision, the feedback resistor Rf is thus desirably not too high in value.

From the foregoing, it is found that the output impedance or the output equivalent circuit of the cascode-connected FET can be approximated by a series equivalent circuit consisting of the output resistance Rout and the output capacitance Cout, depending on the constants of the feedback circuit formed on the cascode-connected FET. Actual circuit designs, however, are made using FET radio-frequency models that are accompanied by various parasitic components. It is therefore more practical to determine the output capacitance Cout and the output resistance Rout through optimization using a radio-frequency circuit simulator rather than based on the numerical calculation discussed here. For example, according to the calculations shown in FIG. 6 where no feedback circuit is provided, the output impedance should be high. Nevertheless, because the actual FET radio-frequency model also has a parasitic capacitance between the drain terminal and the ground, the output impedance shows a low value from the beginning.

Under the condition shown in FIG. 9 where the feedback capacitor Cf of the feedback circuit is given a value of 700 fF and the feedback resistor Rf a value of 275 Ω, the output resistance Rout of the output equivalent circuit of the cascode-connected FET falls within the numerical range of 49 to 53 Ω, the output capacitance Cout of the output equivalent circuit falls within the numerical range of 623 to 513 fF, when in the frequency band of 3 to 5 GHz. If the resistance and the capacitance are not generally constant like this, then it is practical to typify them with averages or center values within the target band. It should be noted that this description of the principle employs a simplified model, and thus does not exactly apply to the examples of numerical values found with radio-frequency models that are used in actual design.

To examine feasible states of matching, BPFs can be connected to this output impedance. The values of the external capacitors and inductors will be determined so as to constitute a third-order Chebyshev BPF as shown in FIG. 1, with examples of numerical values such as a bandwidth of 4.2 GHz, a center frequency of 3.873 GHz, and a ripple of 0.5 dB. The resulting circuit constants are L1=3.03 nH, C1=0.558 pF, L2=2.03 nH, and C2=0.831 pF. In this instance, since C1 corresponds to the output capacitance Cout of the FET, the output capacitance Cout should be set to a value as close to C1 as possible.

Figure 10:
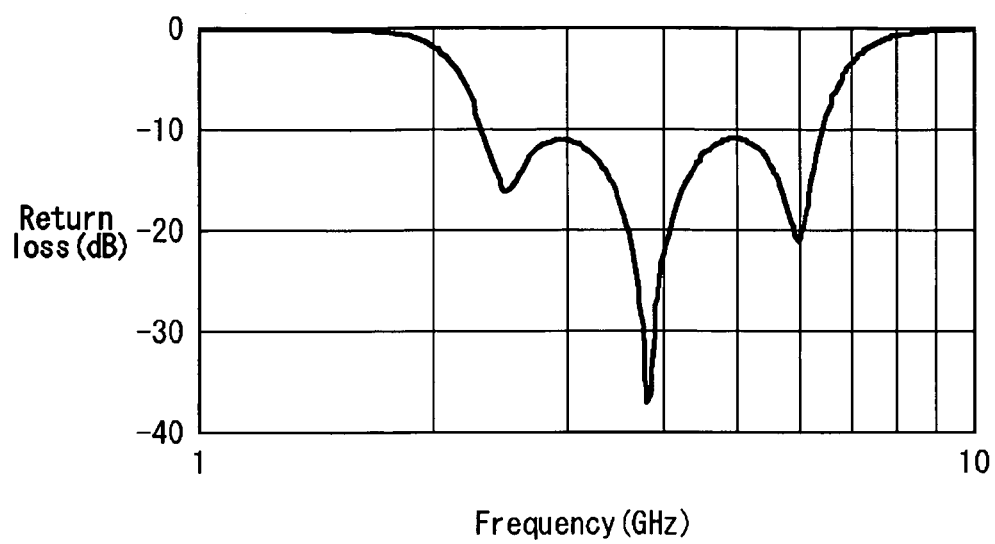
FIG. 10 is a chart showing the frequency dependence of a return loss when a third-order Chebyshev BPF is connected to the output end of the cascode-connected FET that is provided with the feedback circuit according to the embodiment.

FIG. 10 is a chart showing the frequency dependence of a return loss when a third-order Chebyshev BPF is connected to the output end of a cascode-connected FET that is provided with the feedback circuit according to the present embodiment. The horizontal axis indicates the frequency [GHz], and the vertical axis the return loss [dB]. The return loss is an index that indicates 0 dB when all power is returned by total reflection, and −∞ dB when all power is absorbed by loads. That is, higher negative values (in units of dB) translate into a more favorable evaluation of the transmission system. In FIG. 10, a pole of around −37 dB occurs between 3 GHz and 5 GHz. The quality of the return loss and the presence of poles depend on the BPF performance selected.

As above, the feasibility of output matching over a wide bandwidth can be explained by the provision of the feedback circuit consisting of a series circuit of a resistor and a capacitor between the drain terminal and the gate terminal of the common-gate FET (M2) of the cascode-connected FET, and by the provision of a desired BPF circuit on the drain terminal. It should be appreciated that while the principle has been described with regard to a third-order Chebyshev BPF, the same principle also holds for a second-order Butterworth BPF. A description thereof will thus be omitted.

It should be appreciated that the output impedance of the cascode-connected FET mentioned above is derived on the assumption that the series circuit of the feedback resistor Rf and the feedback capacitor Cf is connected at one end to the drain terminal of the common-gate FET and at the other end to a ground potential (see FIG. 5). That is, the other end of the series circuit of the feedback resistor Rf and the feedback capacitor Cf can be connected to either of a ground terminal and a power supply terminal that has a ground potential in terms of alternating current, with the same effect that the output impedance of the cascode-connected FET can be adjusted. The series circuit of the feedback resistor Rf and the feedback capacitor Cf may thus be interposed between the drain terminal of the common-gate FET and the ground terminal or between the drain terminal of the common-gate FET and the power supply terminal.

Figure 11:
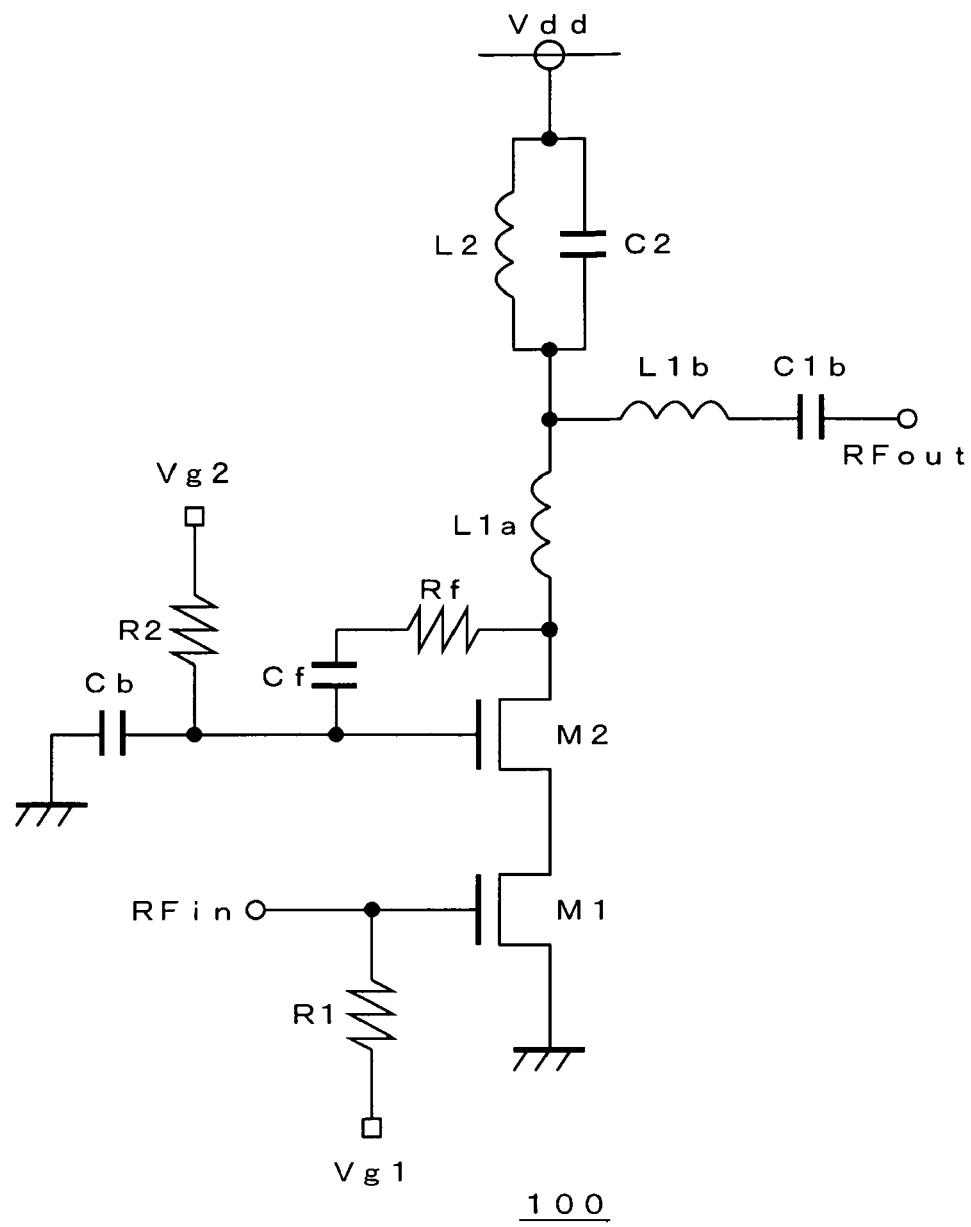
FIG. 11 is a diagram showing the circuit configuration of a wideband output amplifier according to embodiment 1.

Hereinafter, specific embodiments will be described based on the principle of the embodiment described above. FIG. 11 shows the circuit configuration of a wideband output amplifier 100 according to embodiment 1. This wideband output amplifier has the same device connection and configuration as those of the wideband output amplifier 50 shown in FIG. 4. A description thereof will thus be omitted.

A description will now be given of various parameter conditions on the wideband output amplifier 100 according to this embodiment. This wideband output amplifier 100 is intended for use in the 3-to-5 GHz band. The power supply voltage Vdd is set to 1.8 V. Both the common-source FET (M1) and the common-gate FET (M2) constituting the cascode-connected FET are nch-MOSFETs. The common-source FET (M1) and the common-gate FET (M2) both have a gate length of 0.18 μm and a gate width of 200 μm. The first bias voltage Vg1 to the common-source FET (M1) is set to 0.7 V. The second bias voltage Vg2 to the common-gate FET (M2) is set to 1.5 V. The total operating bias current of the cascode-connected FET is set to 10.8 mA. The bypass capacitor Cb is set to 10 pF.

As described above, models that include many parasitic components are used in actual design so that the operations of the radio-frequency MOSFETs are expressed with high precision. For this reason, it is practical to employ an optimization-based technique to derive the output equivalent circuit of the cascode-connected FET that is loaded with a feedback circuit.

Figure 12:
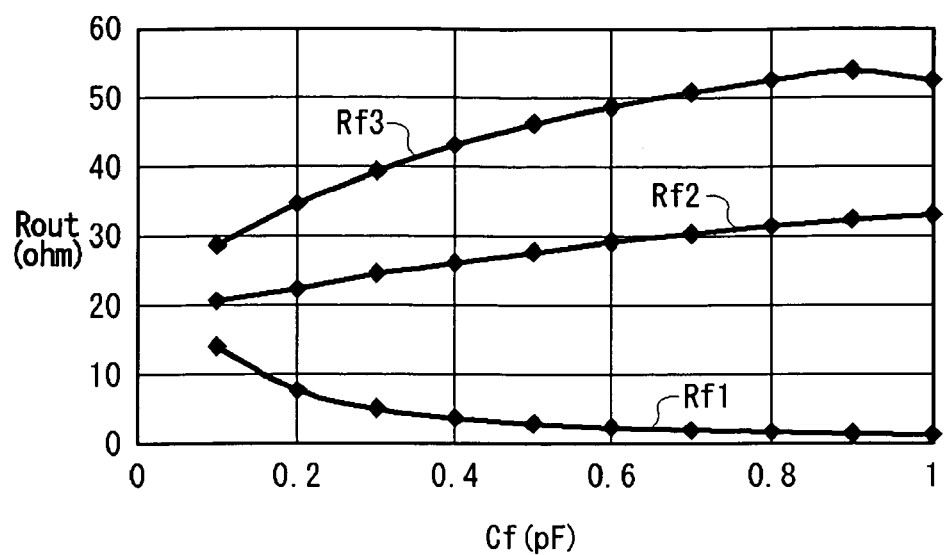
FIG. 12 is a chart showing the feedback circuit dependence of an output resistance Rout among the output equivalent circuit constants of the cascode-connected FET according to embodiment 1.

FIG. 12 is a chart showing the feedback circuit dependence of the output resistance Rout among the output equivalent circuit constants of the cascode-connected FET according to embodiment 1. The horizontal axis indicates the feedback capacitance Cf [pF], and the vertical axis the output resistance Rout [Ω]. The plots are for the cases where the feedback resistor Rf has a value of 0 Ω (denoted as Rf1 in the chart), 50 Ω (denoted as Rf2 in the chart), and 100 Ω (denoted as Rf3 in the chart).

Figure 13:
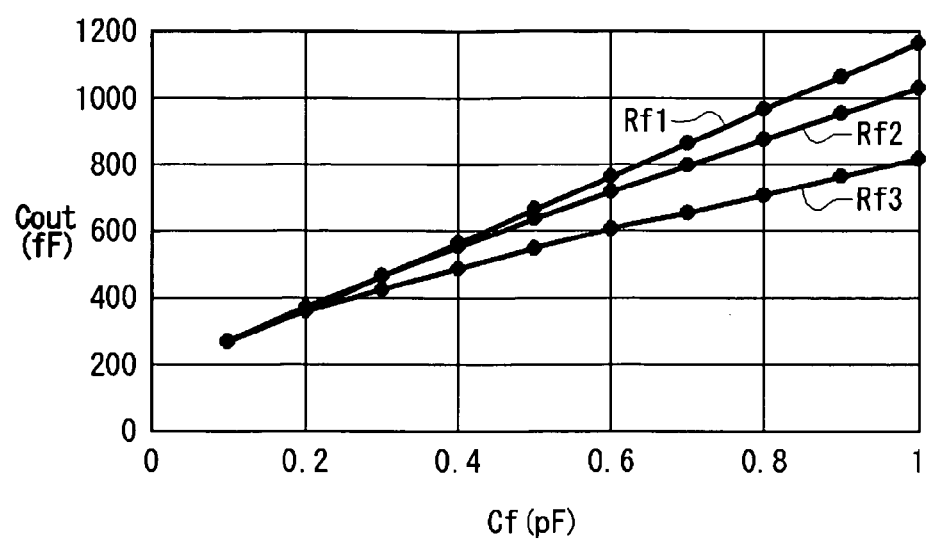
FIG. 13 is a chart showing the feedback circuit dependence of an output capacitance Cout among the output equivalent circuit constants of the cascode-connected FET according to embodiment 1.

FIG. 13 is a chart showing the feedback circuit dependence of the output capacitance Cout among the output equivalent circuit constants of the cascode-connected FET according to embodiment 1. The horizontal axis indicates the feedback capacitance Cf [pF], and the vertical axis the output capacitance Cout [fF]. The plots are for the cases where the feedback resistor Rf has a value of 0 Ω (denoted as Rf1 in the chart), 50 Ω (denoted as Rf2 in the chart), and 100 Ω (denoted as Rf3 in the chart).

As shown in FIGS. 12 and 13, when the values of the feedback resistor Rf and the feedback capacitor Cf constituting the feedback circuit are changed, the output resistance Rout and the output capacitance Cout vary in value. In this instance, the higher the value of the feedback resistor Rf is, the greater the amount of error during optimization becomes. This makes the approximation by the series circuit consisting of the output resistance Rout and the output capacitance Cout difficult. For example, feedback resistances Rf of 100 Ω or higher in value are not practical.

FIG. 14 shows examples of the circuit constants of the third-order Chebyshev BPF according to embodiment 1. These circuit constants are predicated on the basis that the third-order Chebyshev BPF 10 has a reference impedance of 50 Ω and a center frequency of 3.873 GHz. The center frequency fc is the geometric mean of 3 and 5 GHz, determined as sqrt(3 GHz×5 GHz). FIG. 14 shows a table which summarizes examples of feasible combinations of reflection coefficients at the output end and operating bandwidths.

In this embodiment, Cf=0.7 pF and Rf=72.5 Ω are selected as the constants of the feedback circuit. For the constants of the BPF circuit, a ripple of 0.2 dB, a bandwidth of 4.2 GHz, L1=2.325 nH, C1=0.726 pF, L2=1.933 nH, and C2=0.873 pF are selected.

Figure 15:
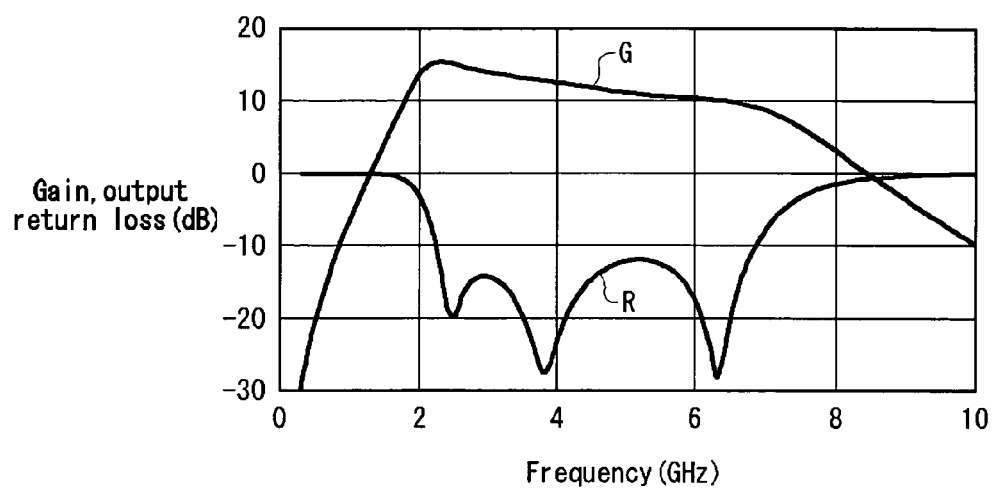
FIG. 15 is a diagram showing the frequency characteristic of the wideband output amplifier according to embodiment 1.

FIG. 15 shows the frequency characteristic of the wideband output amplifier 100 according to embodiment 1. The vertical axis indicates the gain G and the output return loss R [dB], and the horizontal axis the frequency [GHz]. Referring to FIG. 15, it can be seen that output matching is provided but the gain G is not flat.

Figure 16:
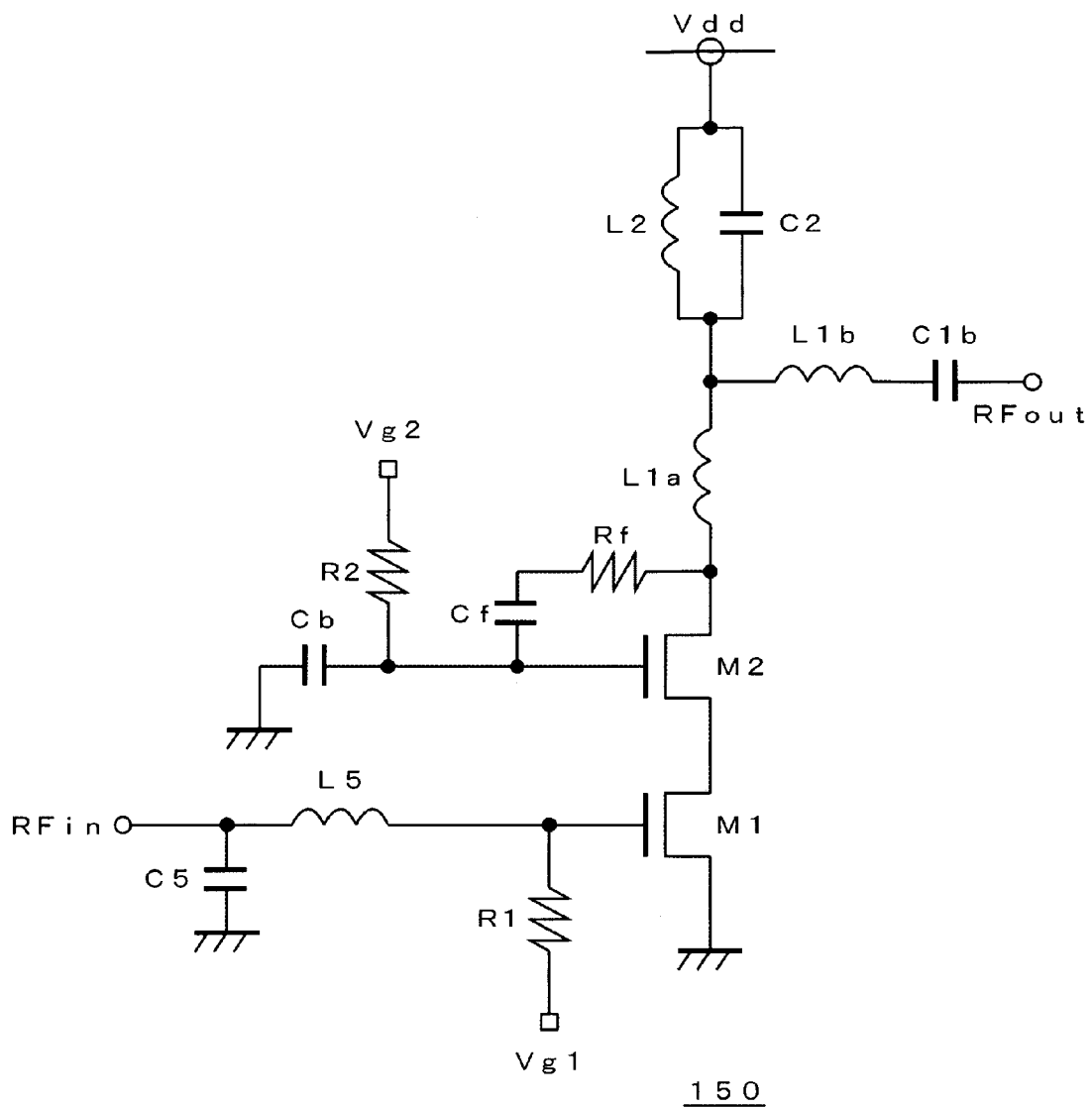
FIG. 16 is a diagram showing the circuit configuration of a wideband output amplifier according to modification 1 of embodiment 1.

FIG. 16 shows the circuit configuration of a wideband output amplifier 150 according to modification 1 of embodiment 1. This wideband output amplifier 150 is configured so that a matching circuit is formed on the input terminal of the wideband output amplifier 100 shown in FIG. 11. In this modification, an LC circuit of inverted L shape is used. More specifically, a fifth inductor L5 is interposed between the gate terminal of the common-source FET (M1) and the input terminal, and a fifth capacitor is interposed between the fifth inductor L5 and the ground. The fifth inductor L5 is set to a value of 2 nH, and the fifth capacitor C5 is set to a value of 0.70 pF. The rest of the configuration is the same as that of the wideband output amplifier 100 shown in FIG. 11, and a description thereof will thus be omitted.

Figure 17:
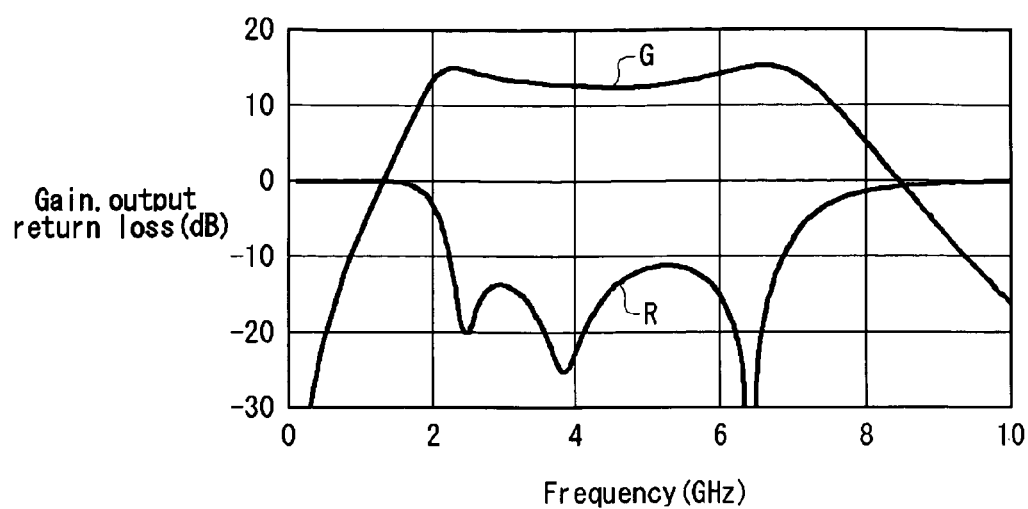
FIG. 17 is a diagram showing the frequency characteristic of the wideband output amplifier according to modification 1 of embodiment 1.

FIG. 17 shows the frequency characteristic of the wideband output amplifier 150 according to modification 1 of embodiment 1. The vertical axis indicates the gain G and the output return loss R [dB], and the horizontal axis the frequency [GHz]. Referring to FIG. 17, it can be seen that the provision of the suitable matching circuit on the input side provides a flat gain G and output matching over a wide bandwidth.

Figure 18:
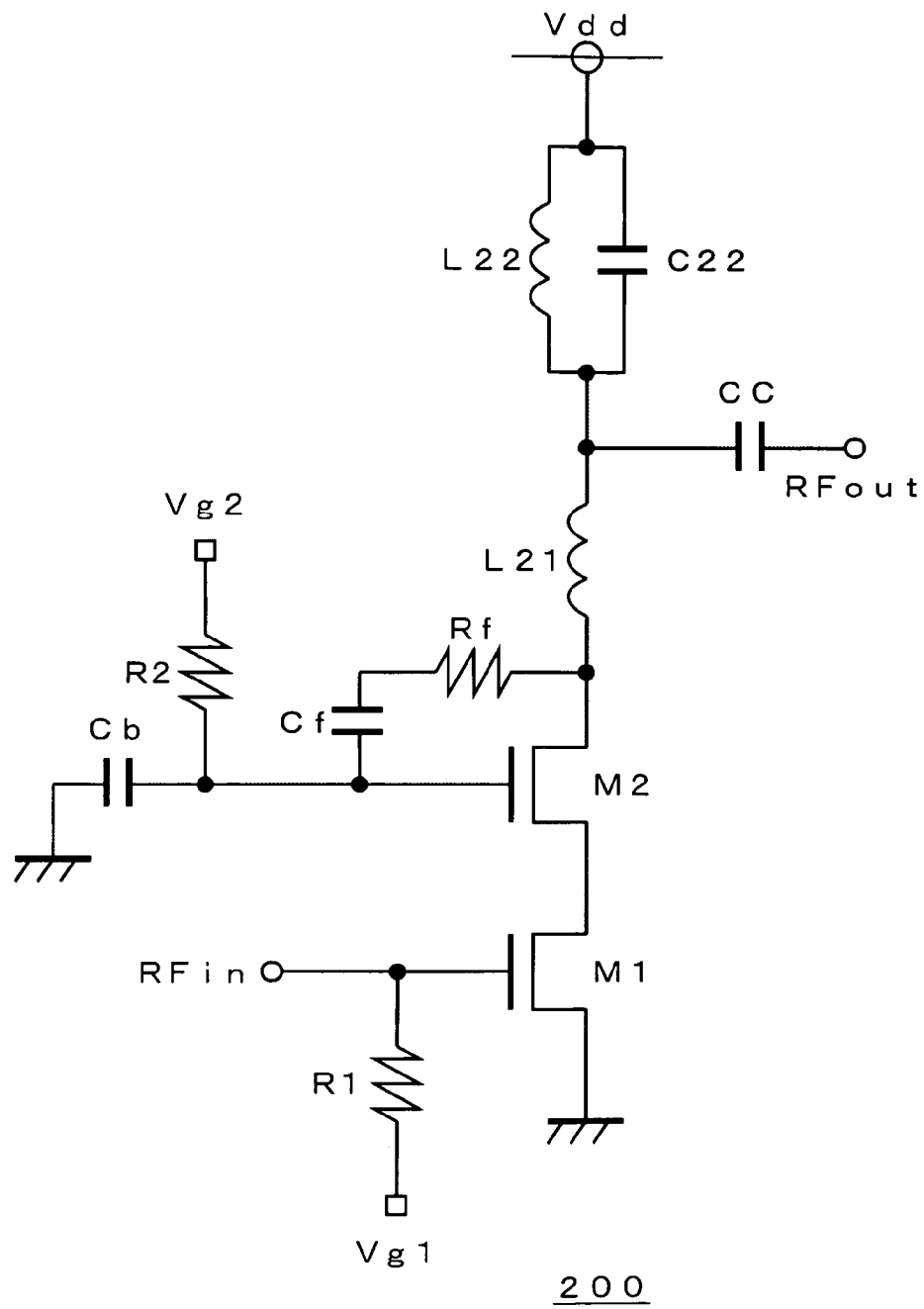
FIG. 18 is a diagram showing the circuit configuration of a wideband output amplifier according to embodiment 2.

FIG. 18 shows the circuit configuration of a wideband output amplifier 200 according to embodiment 2. This wideband output amplifier 200 is configured to implement a second-order Butterworth BPF as a load on the transconductance amplifier which is composed of a cascode-connected FET. This cascode-connected FET has the same configuration as that of the cascode-connected FET of the wideband output amplifier 100 according to embodiment 1 shown in FIG. 11. The output terminal of the second-order Butterworth BPF is connected to a coupling capacitor CC. This coupling capacitor CC prevents direct currents from flowing to the exterior. The coupling capacitor CC must have a high capacitance so as not to affect the BPF characteristics.

The drain terminal of the common-gate FET (M2) is connected to the input terminal of the second-order Butterworth BPF. This second-order Butterworth BPF is configured by omitting the fourth capacitor C21 from the second-order Butterworth BPF shown in FIG. 2. The fourth capacitor C21 is substituted by the output capacitance Cout of the cascode-connected FET. As above, if the output equivalent circuit of the cascode-connected FET can be approximated by a series connection of the output resistance Rout and the output capacitance Cout, and can be adjusted to desired values, then the internal equivalent circuit of the cascode-connected FET can constitute a BPF having desired characteristics, along with the feedback resistor Rf and the feedback capacitor Cf which are connected externally.

A description will now be given of various parameter conditions on the wideband output amplifier 200 according to this embodiment. It should be noted that the bandwidth, the power supply voltage, the gate lengths, gate widths, bias voltages, and bias currents of the FETs used, and the bypass capacitor Cb have the same values as in the wideband output amplifier 100 according to embodiment 1. The coupling capacitor CC is set to 10 pF in value.

FIG. 19 shows examples of the circuit constants of the second-order Butterworth BPF according to embodiment 2. These circuit constants are predicated on the basis that the second-order Butterworth BPF 10 has a reference impedance of 50 Ω and a center frequency of 3.873 GHz. FIG. 19 shows a table which summarizes examples of feasible combinations of reflection coefficients at the output end and operating bandwidths. Butterworth BPFs have ripple-free, flat band-pass band characteristics. The inductances and capacitances are thus uniquely determined once the bandwidth, the center frequency, the order, and the reference impedance are settled.

In this embodiment, Cf=0.55 pF and Rf=75 Ω are selected as the constants of the feedback circuit. For the constants of the BPF circuit, a bandwidth of 4.2 GHz, L21=2.680 nH, C21=0.630 pF, L22=1.576 nH, and C22=1.072 pF are selected.

Figure 20:
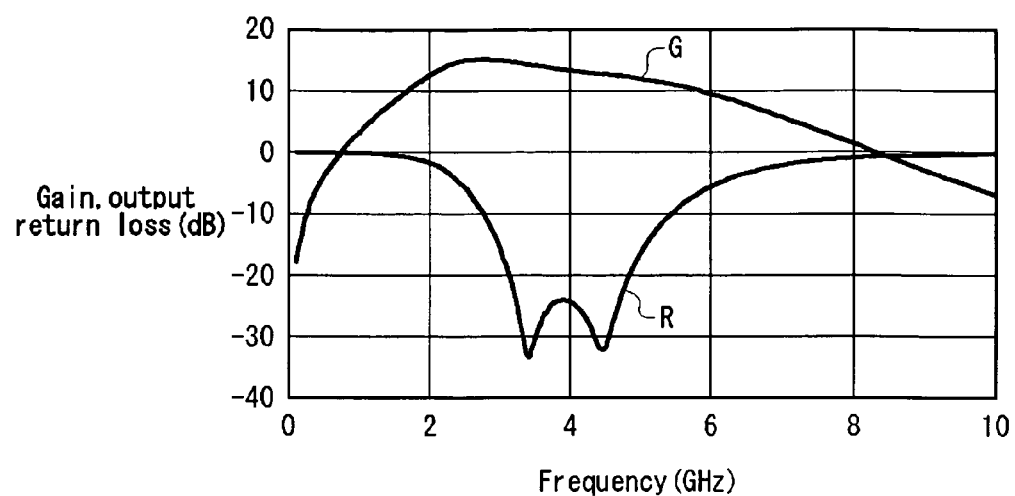
FIG. 20 is a diagram showing the frequency characteristic of the wideband output amplifier according to embodiment 2.

FIG. 20 shows the frequency characteristic of the wideband output amplifier 200 according to embodiment 2. The vertical axis indicates the gain G and the output return loss R [dB], and the horizontal axis the frequency [GHz]. Referring to FIG. 20, it is shown that output matching is provided whereas the gain G is not flat.

Figure 21:
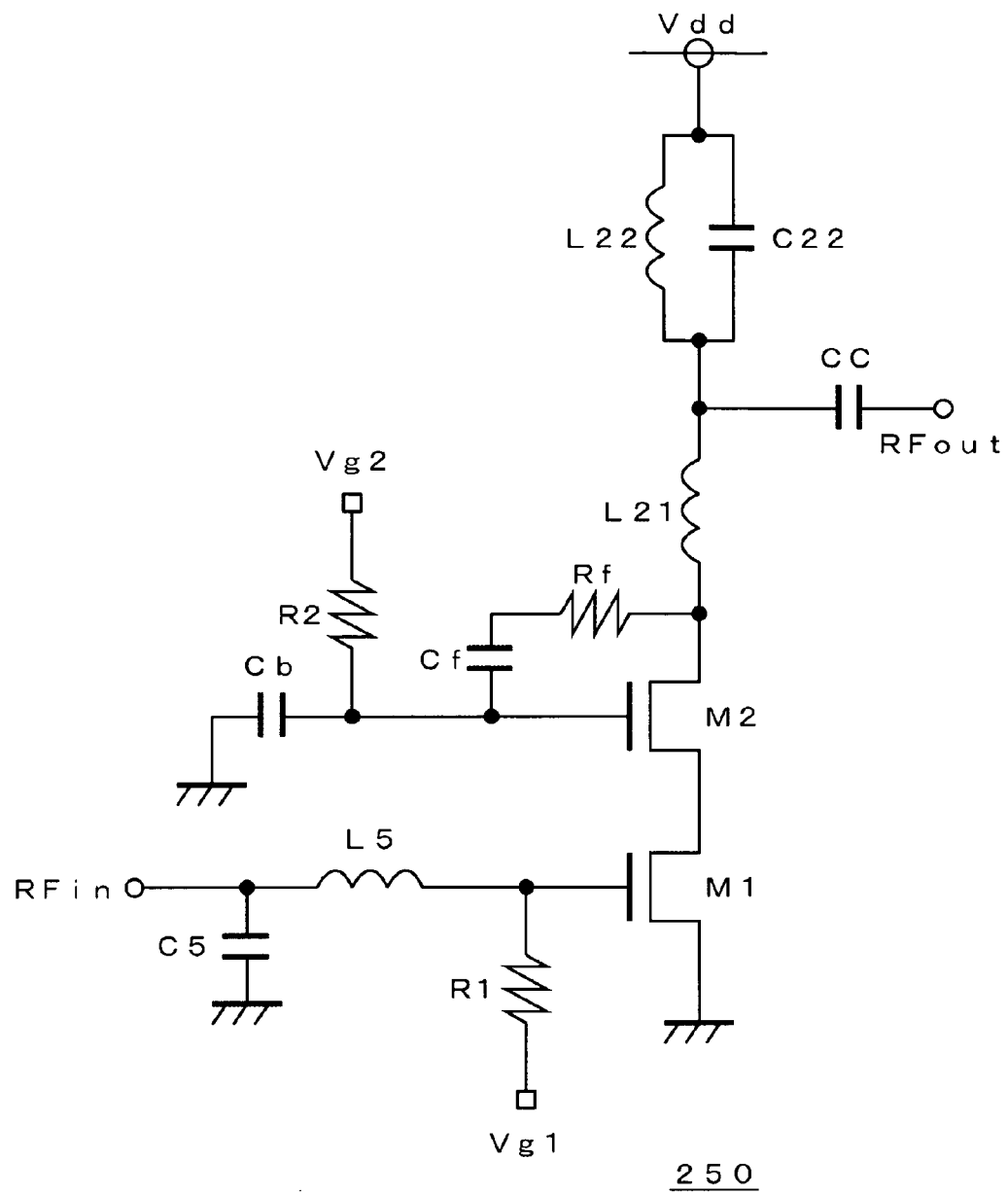
FIG. 21 is a diagram showing the circuit configuration of a wideband output amplifier according to a modification of embodiment 2.

FIG. 21 shows the circuit configuration of a wideband output amplifier 250 according to a modification of embodiment 2. This wideband output amplifier 250 is configured so that a matching circuit is formed on the input terminal of the wideband output amplifier 200 shown in FIG. 18. Like the wideband output amplifier 150 according to modification 1 of embodiment 1 shown in FIG. 16, this modification also uses an LC circuit of inverted L shape as the matching circuit. In this modification, the fifth inductor L5 is set to a value of 2.5 nH, and the fifth capacitor C5 is set to a value of 0.70 pF. The rest of the configuration is the same as that of the wideband output amplifier 200 shown in FIG. 18, and a description thereof will thus be omitted.

Figure 22:
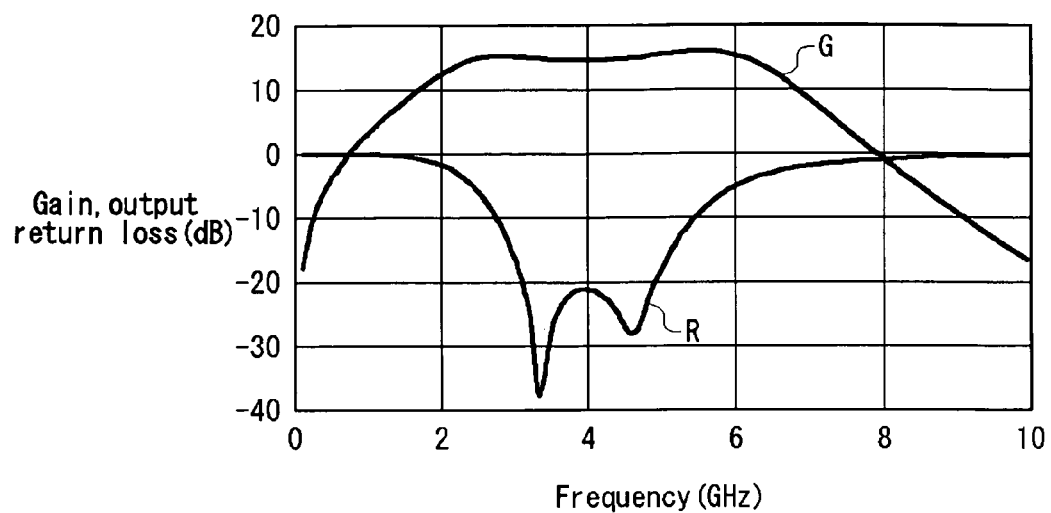
FIG. 22 is a diagram showing the frequency characteristic of the wideband output amplifier according to the modification of embodiment 2.

FIG. 22 shows the frequency characteristic of the wideband output amplifier 250 according to the modification of embodiment 2. The vertical axis indicates the gain G and the output return loss R [dB], and the horizontal axis the frequency [GHz]. Referring to FIG. 22, it is shown that the provision of the suitable matching circuit on the input side provides a flat gain G and satisfies the output matching condition over a wide bandwidth.

Figure 23:
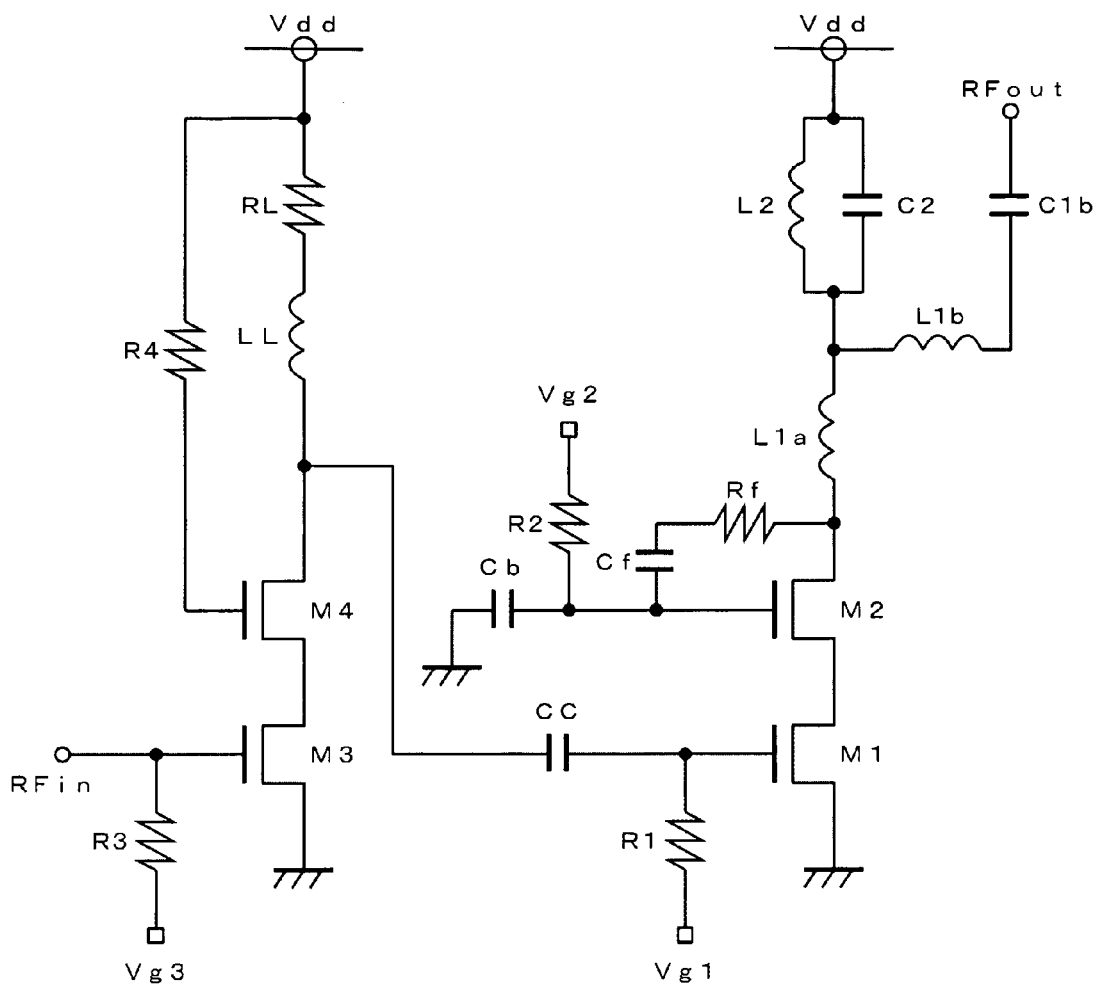
FIG. 23 is a diagram showing the circuit configuration of a wideband output amplifier according to embodiment 3.

FIG. 23 shows the circuit configuration of a wideband output amplifier 300 according to embodiment 3. In order to obtain gain flatness, this wideband output amplifier 300 is configured to include an additional amplifier stage in front of the wideband output amplifier 100 according to embodiment 1. This amplifier stage is configured so that an inductive load is mounted on a transconductance amplifier that is composed of a cascode-connected FET.

This cascode-connected FET is formed by connecting the drain terminal of a common-source FET (M3) and the source terminal of a common-gate FET (M4) to each other. The common-source FET (M3) makes an input stage, and the common-gate FET (M4) an output stage. A third bias voltage Vg3 is applied to the gate terminal of the common-source FET (M3) through a third resistor R3. The radio-frequency signal RFin, a small signal, is input from the prior stage. The source terminal of the common-source FET (M3) is grounded.

The power supply voltage Vdd is applied to the gate terminal of the common-gate FET (M4) as a fourth bias voltage. The drain terminal of the common-gate FET (M4) is connected to the input terminal of a series circuit consisting of a load resistor RL and a load inductor LL, functioning as an inductive load. The output signal of this cascode-connected FET is input to the gate terminal of the common-source FET (M1) in the subsequent stage through the coupling capacitor CC.

A description will now be given of various parameter conditions on the wideband output amplifier 300 according to this embodiment. The power supply voltage Vdd to the amplifiers in the prior stage and the subsequent stage is set to 1.8 V. All the FETs constituting the cascode-connected FETs in the prior stage and the subsequent stage are nch-MOSFETs. These FETs have a gate length of 0.18 μm and a gate width of 100 μm. The first bias voltage Vg1 and the third bias voltage Vg3 to the common-source FETs (M1) (M3) in the prior stage and the subsequent stage are set to 0.7 V. The second bias voltage Vg2 and the fourth bias voltage Vg4 to the common-gate FETs (M2) (M4) in the prior stage and the subsequent stage are set to 1.5 V and 1.8 V, respectively. The total operating bias currents of the cascode-connected FETs are set to 11.3 mA.

Next, with reference to FIG. 14 above, the inductor and capacitor constants are selected. In this embodiment, Cf=0.4 pF and Rf=65 Ω are selected as the constants of the feedback circuit. For the constants of the BPF circuit, a ripple of 0.07 dB, a bandwidth of 2 GHz, L1=3.775 nH, C1=0.447 pF, L2=0.937 nH, and C2=1.803 pF are selected.

Next, RL=40 Ω and LL=2 nH are selected for the load circuit of the cascode-connected FET in the prior stage. The values of the load resistor RL and the load inductor LL are determined in consideration of the gain flatness. Inductive loads like this increase in impedance with an increasing frequency. If the amplifier in the subsequent stage decreases in gain with an increasing frequency, then the amplifier in the prior stage can be combined to flatten the gain within the band.

It should be appreciated that the bypass capacitor Cb and the coupling capacitor CC are given high capacitances. For example, capacitances of 10 pF are applicable. The first resistor R1, the second resistor R2, the third resistor R3, and the fourth resistor R4 are resistors intended for bias application, and therefore may have resistances as high as 2000 Ω or so.

Figure 24:
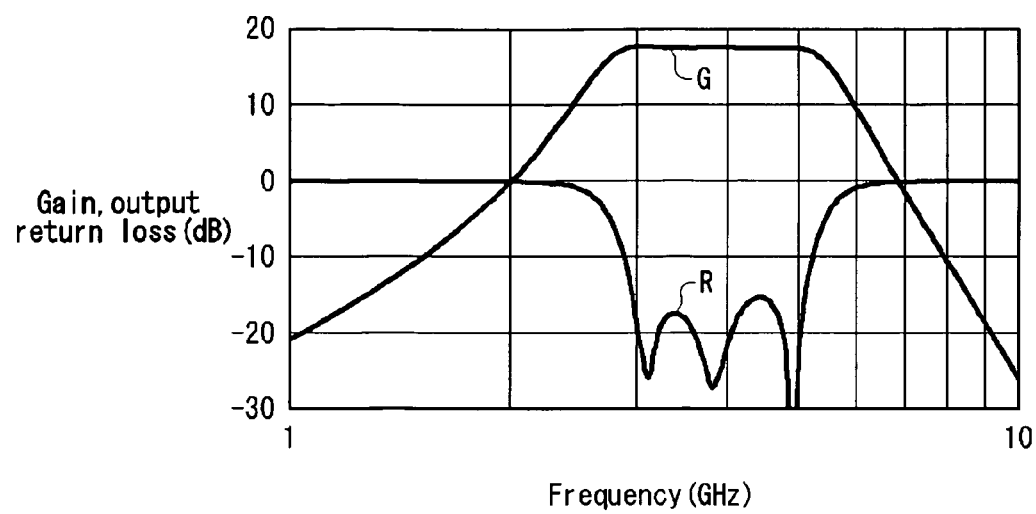
FIG. 24 is a diagram showing the frequency characteristic of the wideband output amplifier according to embodiment 3.

FIG. 24 shows the frequency characteristic of the wideband output amplifier 300 according to embodiment 3. The vertical axis indicates the gain G and the output return loss R [dB], and the horizontal axis the frequency [GHz]. Referring to FIG. 24, it can be clear that the provision of the additional cascode-connected amplifier stage on the input side provides a flat gain G and satisfies the output matching condition over a wide bandwidth.

As is evident from the foregoing description, according to the present embodiment, it is possible to easily set or adjust the characteristics of the band-pass filter and output matching in a consistent fashion. In this respect, if the characteristics of the band-pass filter and the output matching are separately set, the settings may sometimes be inconsistent and require a readjustment.

Among amplifiers capable of output matching over a wide bandwidth are feedback types and distributed constant types, whereas they have problems such as an increased circuit area and increased power consumption. In contrast, according to the present embodiment, it is possible to provide favorable output matching over a wide bandwidth without increasing the circuit area or power consumption as compared to the feedback types and the distributed constant types.

Up to this point, the present invention has been described in conjunction with several embodiments thereof. These embodiments have been given solely by way of illustration. It will be understood by those skilled in the art that various modifications may be made to combinations of the foregoing constituting elements and processes, and all such modifications are also intended to fall within the scope of the present invention.

Figure 25:
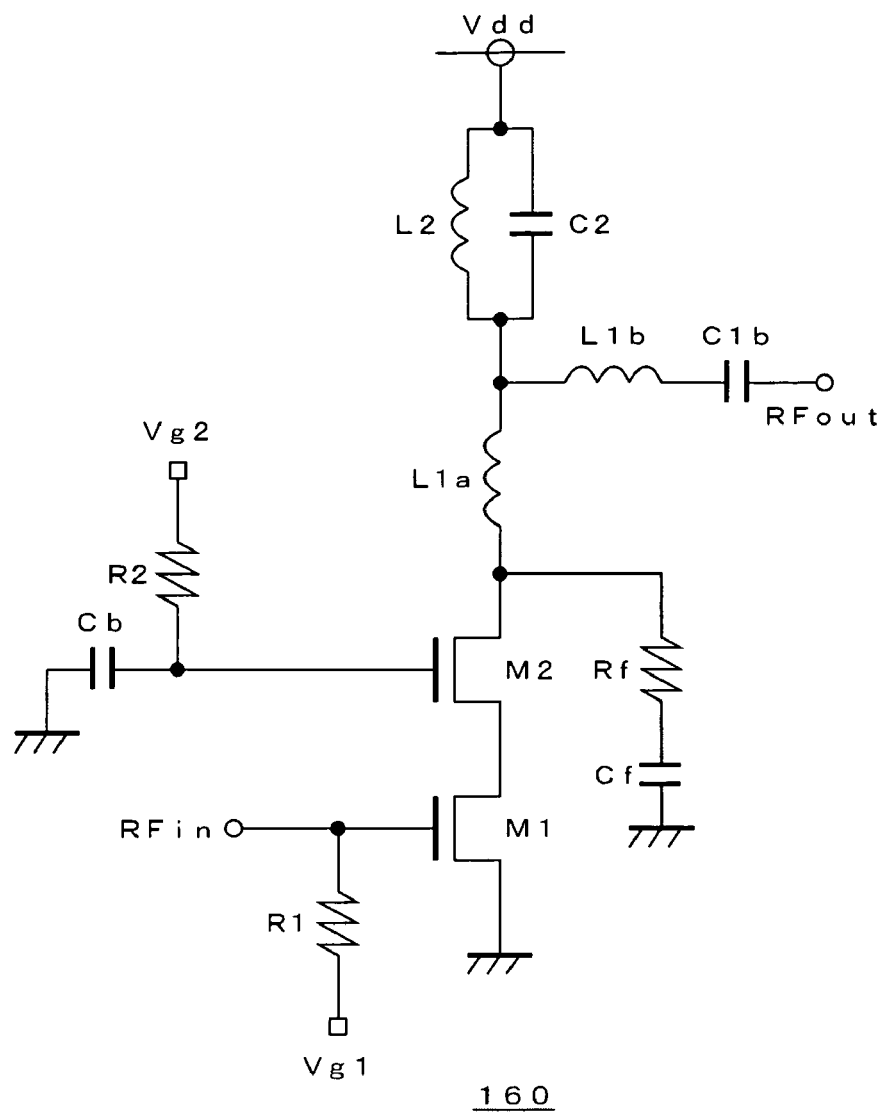
FIG. 25 is a diagram showing the circuit configuration of a wideband output amplifier according to a modification 2 of embodiment 1.

FIG. 25 shows the circuit configuration of a wideband output amplifier 160 according to modification 2 of embodiment 1. In this wideband output amplifier 160, the series circuit having the feedback resistor Rf and the feedback capacitor Cf connected in series is not interposed between the drain terminal and the gate terminal of the common-gate FET (M2) as in the wideband output amplifier 100 shown in FIG. 11. Instead, it is interposed between the drain terminal of the common-gate FET (M2) and the ground terminal. The rest of the configuration is the same as that of the wideband output amplifier 100 shown in FIG. 11, and a description thereof will thus be omitted. This modification also provides the same effects as those of the wideband output amplifier 100 shown in FIG. 11.

Figure 26:
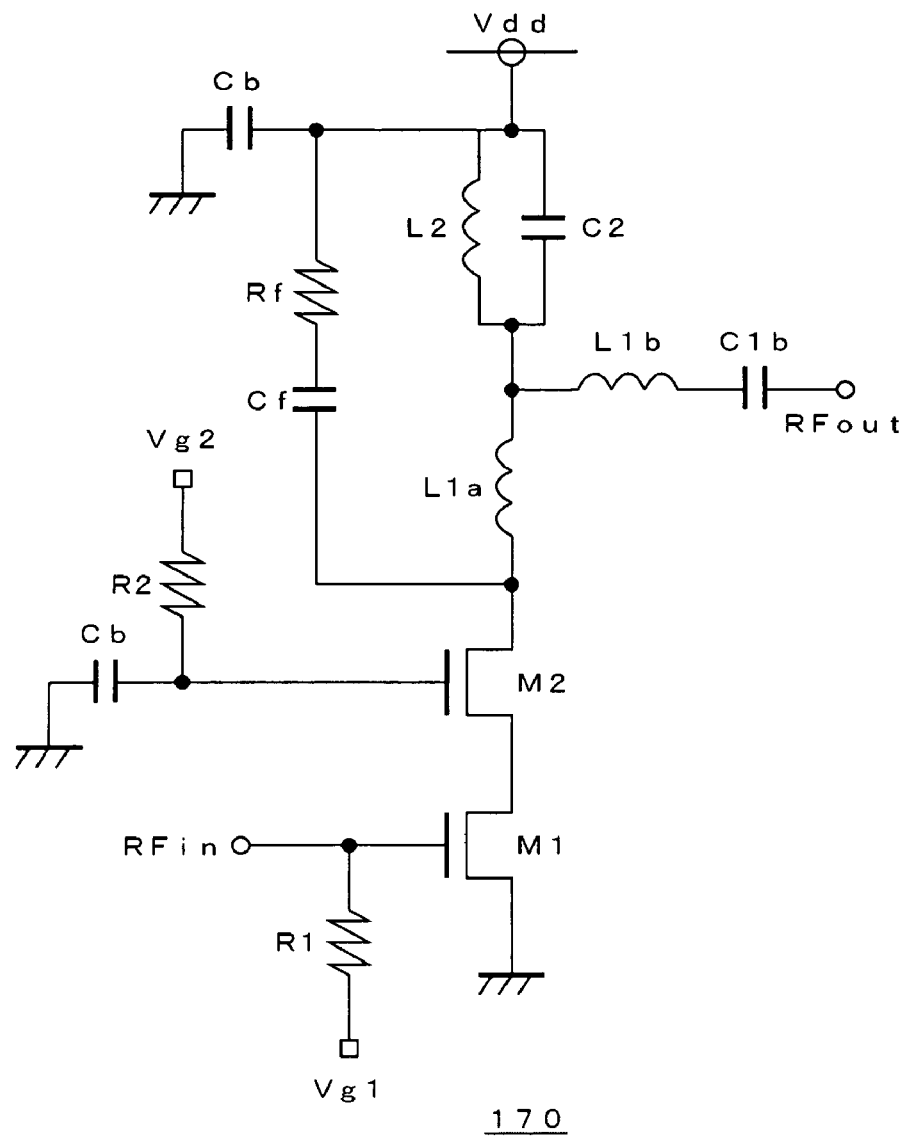
FIG. 26 is a diagram showing the circuit configuration of a wideband output amplifier according to a modification 3 of embodiment 1.

FIG. 26 shows the circuit configuration of a wideband output amplifier 170 according to modification 3 of embodiment 1. In this wideband output amplifier 170, the series circuit having the feedback resistor Rf and the feedback capacitor Cf connected in series is not interposed between the drain terminal and the gate terminal of the common-gate FET (M2) as in the wideband output amplifier 100 shown in FIG. 11. Instead, it is interposed between the drain terminal of the common-gate FET (M2) and the power supply terminal. In this instance, the power supply terminal must be given a ground potential in terms of alternating current using a bypass capacitor or the like. The rest of the configuration is the same as that of the wideband output amplifier 100 shown in FIG. 11, and a description thereof will thus be omitted. This modification also provides the same effects as those of the wideband output amplifier 100 shown in FIG. 11. As above, which location to interpose the series circuit to may be determined depending on a device arrangement and a pattern layout.

The foregoing embodiments have dealt with the cases where a third-order Chebyshev BPF or a second-order Butterworth BPF is provided for the output matching circuit. Nevertheless, the present invention is also applicable to the cases in which BPFs of other orders or different pass band characteristics are used. Similarly, BPFs having reference impedances or constituting elements of different values are also applicable as well. The active elements are not limited to FETs, but may also be bipolar transistors. The active elements may be differential configurations. Aside from amplifiers, radio-frequency circuits that output GHz-band signals, such as a mixer that uses cascode-connected FETs, are also applicable.

It should be appreciated that the foregoing embodiments have used actual radio-frequency models for the FETs and ideal device models for the inductors and capacitors of the matching circuit in order to clarify the principle of the invention.

What is claimed is:

1. An amplifier comprising a cascode-connected transistor which includes:
   a common-source transistor which receives an input signal;
   a common-gate transistor which is connected to a drain terminal of the common-source transistor and outputs an output signal, wherein an adjustment circuit for adjusting an output impedance of the cascode-connected transistor is interposed between a drain terminal and a gate terminal of the common-gate transistor and wherein the adjustment circuit is composed of a series circuit including an adjustment resistor and an adjustment capacitor; and
   a band-pass filter which receives the output signal of the cascode-connected transistor,
   the band-pass filter including:
      a first inductor which is connected to the drain terminal of the common-gate transistor;
      a parallel circuit of a second inductor and a second capacitor which are interposed between the other terminal of the first inductor and a power supply terminal; and
      a series circuit of a third inductor and a third capacitor which are interposed between the other terminal of the first inductor and an output terminal of the amplifier.

2. An amplifier comprising a cascode-connected transistor which includes:
   a common-source transistor which receives an input signal;
   a common-gate transistor which is connected to a drain terminal of the common-source transistor and outputs an output signal. wherein an adjustment circuit for adjustment; an output impedance of the cascode-connected transistor is interposed between a drain terminal of the common-gate transistor and a terminal that is grounded in terms of alternating current and wherein the adjustment circuit is composed of a series circuit including an adjustment resistor and an adjustment capacitor; and
   a band-pass filter which receives the output signal of the cascode-connected transistor,
   the band-pass filter including:
      a first inductor which is connected to the drain terminal of the common-gate transistor;
      a parallel circuit of a second inductor and a second capacitor which are interposed between the other terminal of the first inductor and a power supply terminal; and
      a series circuit of a third inductor and a third capacitor which are interposed between the other terminal of the first inductor and an output terminal of the amplifier.

3. An amplifier comprising a cascode-connected transistor which includes:
   a common-source transistor which receives an input signal;
   a common-gate transistor which is connected to a drain terminal of the common-source transistor and outputs an output signal, wherein an adjustment circuit for adjusting an output impedance of the cascode-connected transistor is interposed between a drain terminal and a gate terminal of the common-gate transistor and wherein the adjustment circuit is composed of a series circuit including an adjustment resistor and an adjustment capacitor; and
   a band-pass filter which receives the output signal of the cascode-connected transistor,
   the band-pass filter including:
      a first inductor which is connected to the drain terminal of the common-gate transistor; and
      a parallel circuit of a second inductor and a second capacitor which are interposed between the other terminal of the first inductor and a power supply terminal, and wherein the other terminal of the first inductor is connected to an output terminal of the amplifier.

4. An amplifier comprising a cascode-connected transistor which includes:
   a common-source transistor which receives an input signal;
   a common-gate transistor which is connected to a drain terminal of the common-source transistor and outputs an output signal, wherein an adjustment circuit for adjusting an output impedance of the cascode-connected transistor is interposed between a drain terminal of the common-gate transistor and a terminal that is grounded in terms of alternating current and wherein the adjustment circuit is composed of a series circuit including an adjustment resistor and an adjustment capacitor; and
   a band-pass filter which receives the output signal of the cascode-connected transistor,
   the band-pass filter including:
      a first inductor which is connected to the drain terminal of the common-gate transistor; and
      a parallel circuit of a second inductor and a second capacitor which are interposed between the other terminal of the first inductor and a power supply terminal, and wherein
   the other terminal of the first inductor is connected to an output terminal of the amplifier.

5. An amplifier comprising a cascode-connected transistor which includes:
   a common-source transistor which receives an input signal;
   a common-gate transistor which is connected to a drain terminal of the common-source transistor and outputs an output signal, wherein an adjustment circuit for adjusting an output impedance of the cascode-connected transistor is interposed between a drain terminal and a gate terminal of the common-gate transistor; and
   an amplifier stage in front of the cascode-connected transistor, the amplifier stage having a series circuit of a load inductor and a load resistor as a load.

6. An amplifier comprising a cascode-connected transistor which includes:
   a common-source transistor which receives an input signal;
   a common-gate transistor which is connected to a drain terminal of the common-source transistor and outputs an output signal, wherein an adjustment circuit for adjusting an output impedance of the cascode-connected transistor is interposed between a drain terminal of the common-gate transistor and a terminal that is grounded in terms of alternating current; and
   an amplifier stage in front of the cascode-connected transistor, the amplifier stage having a series circuit of a load inductor and a load resistor as a load.

7. An amplifier comprising a cascode-connected transistor which includes:
   a common-source transistor which receives an input signal;

a common-gate transistor which is connected to a drain terminal of the common-source transistor and outputs an output signal, wherein an adjustment circuit for adjusting an output impedance of the cascode-connected transistor is interposed between a drain terminal and a gate terminal of the common-gate transistor and wherein the adjustment circuit is composed of a series circuit including an adjustment resistor and an adjustment capacitor; and an amplifier stage in front of the cascode-connected transistor, the amplifier stage having a series circuit of a load inductor and a load resistor as a load.

8. An amplifier comprising a cascode-connected transistor which includes:

a common-source transistor which receives an input signal;

a common-gate transistor which is connected to a drain terminal of the common-source transistor and outputs an output signal, wherein an adjustment circuit for adjusting an output impedance of the cascode-connected transistor is interposed between a drain terminal of the common-gate transistor and a terminal that is grounded in terms of alternating current and wherein the adjustment circuit is composed of a series circuit including an adjustment resistor and an adjustment capacitor; and an amplifier stage in front of the cascode-connected transistor, the amplifier stage having a series circuit of a load inductor and a load resistor as a load.

* * * * *